United States Patent  [19]

Hsu et al.

(12) United States Patent
Hsu et al.

(10) Patent No.: US 6,347,258 B1
(45) Date of Patent: Feb. 12, 2002

(54) DATA STRUCTURE OF A PRODUCT TECHNOLOGY AND A METHOD OF PREPARING THE SAME

(75) Inventors: Chi-Sen Hsu; Shu-Chun Yuan, both of Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 09/635,497

(22) Filed: Aug. 9, 2000

(30) Foreign Application Priority Data

Sep. 23, 1999 (TW) ........................................ 88116360 A (51) Int. Cl.[7] .............................................. G06F 19/00
(52) U.S. Cl. ......................... 700/121; 700/97; 700/117
(58) Field of Search ............................ 700/97, 99, 117, 700/119, 120, 121

(56) References Cited

U.S. PATENT DOCUMENTS 5,644,144 A  *  7/1997  Ray ............................. 257/48
5,694,325 A  *  12/1997  Fukuda et al. ......... 364/468.28
5,777,877 A  *  7/1998  Beppu et al. .......... 364/468.03

FOREIGN PATENT DOCUMENTS

WO          WO 00/13115          3/2000

* cited by examiner

*Primary Examiner*—Paul P. Gordon
(74) *Attorney, Agent, or Firm*—Darby & Darby (57) ABSTRACT

The present invention provides a data structure relating to a product and a method of preparing the same to set up the data structure. The data structure is stored in the memory of a computer comprising a technology table, a product table, and a tool table (or a mask table). The technology table comprises a technology ID and a process layer data for recording the information of each process layer, wherein the process layer data comprises a plurality of layer codes. Each layer code corresponds to a process layer. In addition, the product table comprises a product ID and a product link table for providing a link to the technology table. The tool table comprises at least one tool ID for each process layer and a tool link table for providing a link to the product table. The method of preparing the data structure of a product according to the present invention comprises, in sequence, storing the technology table, storing the product table, creating the tool ID for each process layer to establish a tool table, and storing said tool table in the memory of a computer.

9 Claims, 7 Drawing Sheets

Technology Maintain (R)

Toolbar: New | Update | Delete | Save | Cancel | Exit

狀態: ○ 生效  ◎ 申請中  ○ 保留

申請人 ☐  建檔日期 ☐
異動人 ☐  異動日期 ☐
　　　　　生效日期 ☐

Technology

Select Technology ID: [A25DPWA1 ▼]   — 30   12

Photo Layer

Insert/Delete: [Insert Layer] [Delete Layer]

Insert Mask Direction: ◎ After  ○ Before   — 32

Reference Layer Name: [ ▼ ]

| Seq | Layer_Name | Mask_Code | Remarks |
|-----|------------|-----------|---------|
| 1 | AA | 120 | |
| 2 | NW | 192 | |
| 3 | PW | 191 | |
| 4 | POLY1 | 131 | |
| 5 | NLDD | 198 | |
| 6 | N+ | 198 | |
| 7 | P+ | 197 | |
| 8 | ESD | 110 | |
| 9 | CONTACT | 150 | |
| 10 | METAL1 | 161 | |
| 11 | MV1 | 151 | |
| 12 | METAL2 | 162 | |
| 13 | MV2 | 152 | |
| 14 | METAL3 | 163 | |
| 15 | PAD | 107 | |
| 16 | POLYIMIDE | 108 | |

| | Product ID | Sales Type |
|---|---|---|
| 狀態 ○生效 ⊙申請中 ○保留 | 1002A-W ▼ | W |
| FAB | Mask | CP | As |

Mask

| pm_LayerSeq | pm_LayerName | pm_Maskcode | mb_MaskId |
|---|---|---|---|
| 1 | AA | 120 | 1002-120A-Z002 |
| 2 | NW | 192 | 1002-192A-Z000 |
| 3 | PW | 191 | 1002-191A-Z000 |
| 4 | POLY1 | 131 | 1002-131A-Z000 |
| 5 | NLDD | 198 | 1002-198A-Z000 |
| 6 | N+ | 198 | 1002-198A-Z000 |
| 7 | P+ | 197 | 1002-197A-Z000 |
| 8 | ESD | 110 | 1002-110A-Z000 |
| 9 | CONTACT | 150 | 1002-150A-Z000 |
| 10 | METAL1 | 161 | 1002-161A-Z000 |
| 11 | MV1 | 151 | 1002-151A-Z000 |
| 12 | METAL2 | 162 | 1002-162A-Z000 |
| 13 | MV2 | 152 | 1002-152A-Z000 |
| 14 | METAL3 | 163 | 1002-163A-Z000 |
| 15 | PAD | 107 | 1002-107A-Z000 |
| 16 | POLYIMIDE | 108 | 1002-108A-Z000 |

DATA STRUCTURE OF A PRODUCT TECHNOLOGY AND A METHOD OF PREPARING THE SAME

BACKGROUND OF THE INVENTION

1. Field of the Invention

The present invention relates to a data structure of a product technology and a method of preparing the same. More particularly, the present invention relates to a data structure suitable for preparing, maintaining, and checking the process data of a product technology applicable to the semiconductor industry.

2. Description of the Related Art

In the semiconductor industry, a product, typically a semiconductor chip, is produced only after hundreds of process steps are performed such as a clean process, a lithography process, an ion implant process, a chemical vapor deposition process and so on. Typically, A product technology is devised or developed, depending on the required production capacity, by a team of process/manufacturing engineers and researchers based in a semiconductor chip fabrication plant or commonly known as the FAB. For example, a 0.18 logic technology means a technology capable of fabricating a logic IC with a minimal line width, which is 0.18 micron.

In fact, a product technology, after it has been devised or developed, can be so versatile that different products can be produced by applying the same product technology. For example, the CPU manufacturer Intel can require FAB houses to fabricate CPUs with the 0.18 logic technology, which can as well be required by a chipset design house, such as VIA, to apply the same 0.18 logic technology for fabricating chipsets that meets the demand. Thereby, different products can be manufactured according to the needs of such logic IC design houses as Intel and VIA by simply substituting different sets of masks supplied by the design houses.

Nonetheless, the traditional method for handling a new product to be released to a FAB house for production typically involves an overwhelming amount of data transferring, sometimes repeating, among such internal departments as the sales, process integration, mask manufacturing, and wafer manufacturing, which also means that numerous forms needs to be signed off before the production plan of a new product can be finalized. As a result, the traditional method is proving to be extremely time-consuming and often times causing inconsistencies and errors when transferring revised data.

SUMMARY OF THE INVENTION

It is an object of the present invention to provide a data structure comprised of inter-linked data sets or tables for ensuring the consistency of relevant data sets included in a product technology and the products manufactured thereby.

It is another object of the present invention to provide a method of preparing a data structure for collecting and maintaining the data set of a product systematically to ensure the consistency of data relevant to the product.

To achieve the above-mentioned objects, the present invention provides a data structure comprising a technology table, a product table, and a tool table such that the data structure is suitable for preparing and maintaining a plurality of relevant data sets stored in the memory of a computer.

Wherein, the technology table records the specifications of a product technology relevant to one or more products. In addition, the technology table comprises at least a technology ID for identifying the product technology used to manufacture the product, a technology data for recording the product technology used in fabricating the product, and a process layer data for recording relevant information of each process layer. The process layer data are also called photo layer data because the word "process" implies a photolithography process according to the present invention. Furthermore, the technology data at least comprises a design rule, a FAB ID, a product type, a number of poly layer, a number of metal layer, a number of photo layer, and a technology description.

The product table records the specifications of a product. The product table at least comprises a product ID for identifying the product and product data containing descriptions or features of a product. Furthermore, the product data at least comprises a product link table for providing a link to the technology table, wafer size, packing specifications, and brand information.

The tool table is also called a mask table because the typical tool used in fabricating the product during a semiconductor process is a mask. The tool table comprises a tool link table for providing a link to the product table and the tool IDs. Furthermore, the tool IDs are linked up with layer codes via the product link table and the tool link table.

The advantage of the data structure according to the present invention is that the consistency of the data among the technology table, the product table, and the tool table can be easily maintained since the tables mutually linked among each other.

The present invention also provides a method of preparing the data structure of a product technology through a computer and storing the data structure in the memory of the computer thereafter, wherein the method comprises storing a technology table that includes at least a technology ID and a process layer data in the memory of a computer for recording a product technology used by the product; storing a product table for recording the specification of the product in the memory of a computer such that the product table is linked with the technology table; creating a tool table containing tool IDs which are linked with corresponding layer codes in the technology table and then storing the tool table in the memory of a computer.

Wherein, the technology table at least comprises a technology ID for identifying the product technology used by the product and a process layer data for recording the information of each process layer. The process layer data, which is also called a photo layer data, comprises a plurality of layer codes for distinguishing each of the process layers.

The product table at least comprises a product ID for identifying the product and a product data for making a description of the product. The product data comprises a product link table for providing a link to the technology table.

The tool table, which is also called a mask table, comprises a tool link table for providing a link to the product table.

Therefore, the technology table, the product table, and the tool table are established with links among each other. At the same time, the data structure according to the present invention is set up by strictly following the procedures of a flowchart executable by a computer to prevent possible errors in signing off approval forms to be passed around among different departments within an organization from occurring. Thus, the efficiency in manufacturing a product is enhanced according to the present invention such that the data among the technology table, the product table, and the tool table can be updated consistently, globally, and automatically due to the inter-linked characteristic of said tables.

BRIEF DESCRIPTION OF THE DRAWINGS

The following detailed description, given by way of examples and not intended to limit the invention to the embodiments described herein, will best be understood in conjunction with the accompanying drawings, in which.

DETAILED DESCRIPTION OF THE PREFERRED EMBODIMENT

The Data Structure

Figure 1:
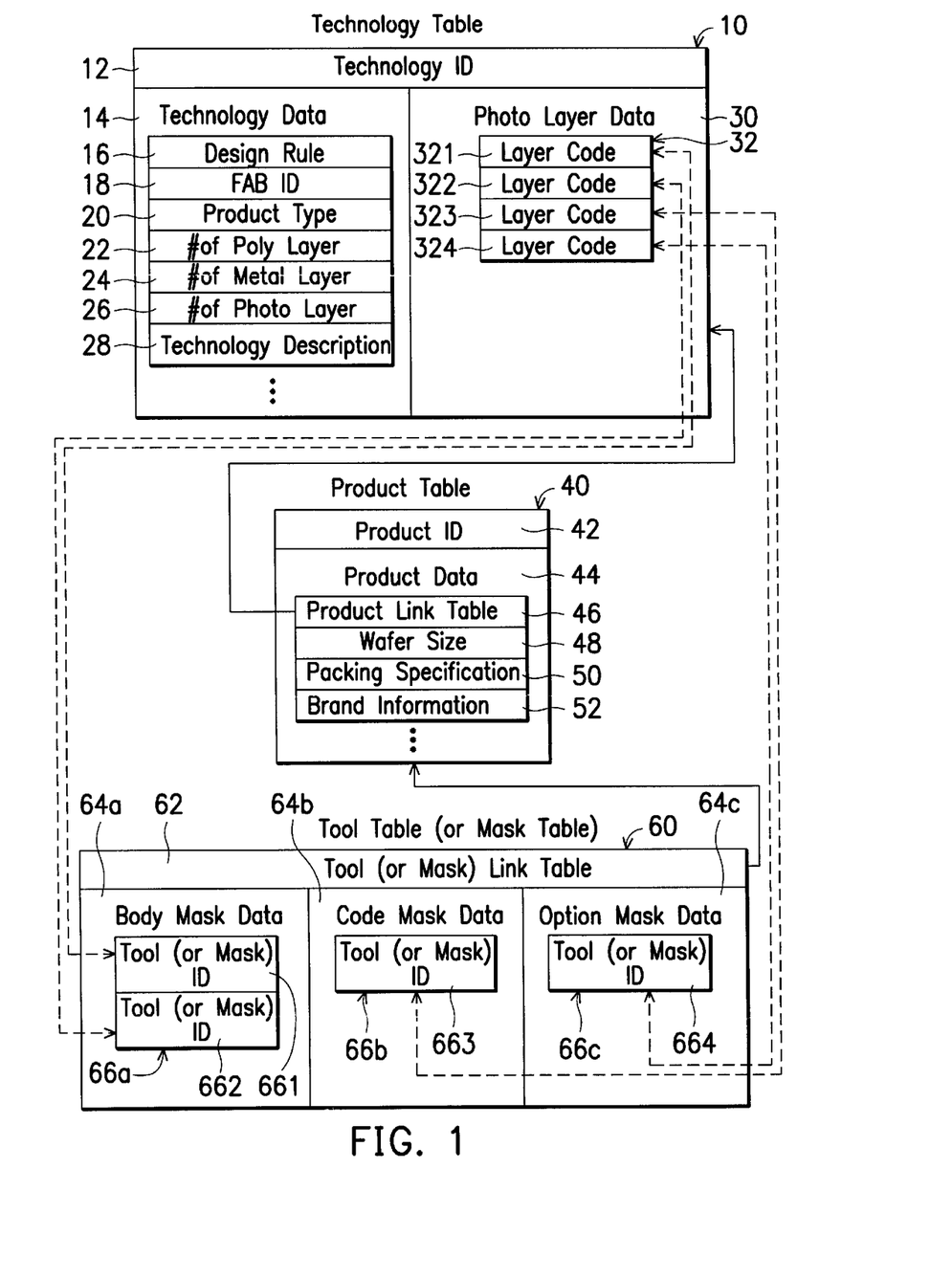
FIG. 1 shows the data structure of a product technology for the semiconductor industry according to the present invention.

FIG. 1 shows the data structure of a product technology for systemizing the production of semiconductor chips on wafers according to the present invention.

The data structure of a product technology according to the present invention is suitable for preparing and maintaining the data of a product storable in the memory of a computer, wherein the data structure is comprised of three inter-linked table—a technology table 10, a product table 40, and a tool table 60. The typical tool used in fabricating the product by a semiconductor process is a mask, hence the tool table 60 is called a mask table 60 herewith. The major functions of the technology table 10, the product table 40, and the mask table 60, respectively, are technology maintaining, product maintaining, and mask maintaining. Each major function is then divided into several sub-functions for further specifying the product technology. Detailed descriptions of the technology table 10, the product table 40 and the mask table 60 are given as follows.

The technology table 10 records the product technology used by a specific product. The technology table 10 comprises at least a technology ID 12 for identifying the product technology used by the product, a technology data 14 for recording the product technology used in the fabrication of the product, and a process layer data 30 for recording the information of each process layer. The process layer data 30 is also called a photo layer data 30 because the process according to an embodiment of the present invention means a photolithography process. In addition, the technology data 14 at least comprises a design rule 16, a FAB ID 18, a product type 20, a plurality of poly layer 22, a plurality of metal layer 24, a plurality of photo layer 26, and a technology description 28. The photo layer data 30 comprises at least one layer code 32. In FIG. 1, for example, the photo layer data 30 has four layer codes 321, 322, 323, and 324, wherein each layer code 32 corresponds to a process layer.

Furthermore, the product table 40 records the specification of the product. The product table 40 at least comprises a product ID 42 for identifying the product and a product data 44 for making a description of the product's features. The product data 44 at least comprises a product link table 46 for providing a link to the technology table 10, a wafer size 48, a packing specification 50, and brand information 52.

The mask table 60 comprises a mask link table 62 for providing a link to the product table 40. The mask table 60 is divided into three types by function: body mask data 64a, code mask data 64b, and option mask data 64c. The masks that belong to the body mask data 64a are used to form the body of the semiconductor chip by defining a plurality of active regions, polygates, N type wells, P type wells etc. on a substrate. The masks that belong to the code mask data 64b are used to define specified layers to code the semiconductor chip, and hence these masks are called code masks. For example, the code masks are used to define the programmed codes in a mask read only memory (mask ROM). Different mask ROM products differ by the mask used to define the programmed codes. The masks that belong to the option mask data 64c are used to define a plurality of specified layers to form a special group of products which only requires the change of a mask to define a different metal layer.

The body mask data 64a comprises at least one mask ID 66a, such as the two masks IDs 661 and 662 of the body mask data 64a shown in FIG. 1. The code mask data 64b comprise at least one mask ID 66b, such as the mask ID 663 of the code mask data 64b shown in FIG. 1. The option mask data 64c comprise at least one mask ID 66c, such as the mask ID 664 of the option mask data 64c shown in FIG. 1. According to the above-mentioned description, therefore, the mask IDs 661, 662, 663, and 664, respectively, are linked up with the layer codes 321, 322, 323, and 324 by the product link table 46 and mask link table 62.

It is worthy of note that the mask IDs 66a, 66b and 66c are also referred to as tool IDs 66a, 66b and 66c; a mask link table 62 is also referred to as a tool link table 62, as shown in FIG. 1.

According to the data structure of the present invention, the links among the technology table 10, the product table 40, and the mask table 60 ensure that relevant process data of a product technology and the products themselves are consistent at all times. Therefore, relevant information contained in the technology table 10 can be found by first referring to the linked product table 40, wherein the product table 40 is also linked to a corresponding mask table 60.

The present invention therefore is characterized by that a user can conveniently read into or amend the data included in the data structure according to the present invention without causing inconsistent data within the data structure. For example, the inside sales department of a company can track the scheduled progress of a mask produced by a mask manufacturing department or company by actively checking the related product technology and product specification via a computer network according to the present invention. Similarly, a chip fabricating department can also access the same product technology and product specification according to the data structure of the present invention and proceed the chip-fabricating process with an accurate mask.

Accordingly, the advantage of using the data structure according to the present invention is that the data linked among the technology table 10, the product table 40, and the mask table 60 can be globally, consistently, and automatically updated.

METHOD OF PREPARING THE DATA STRUCTURE

Figure 2:
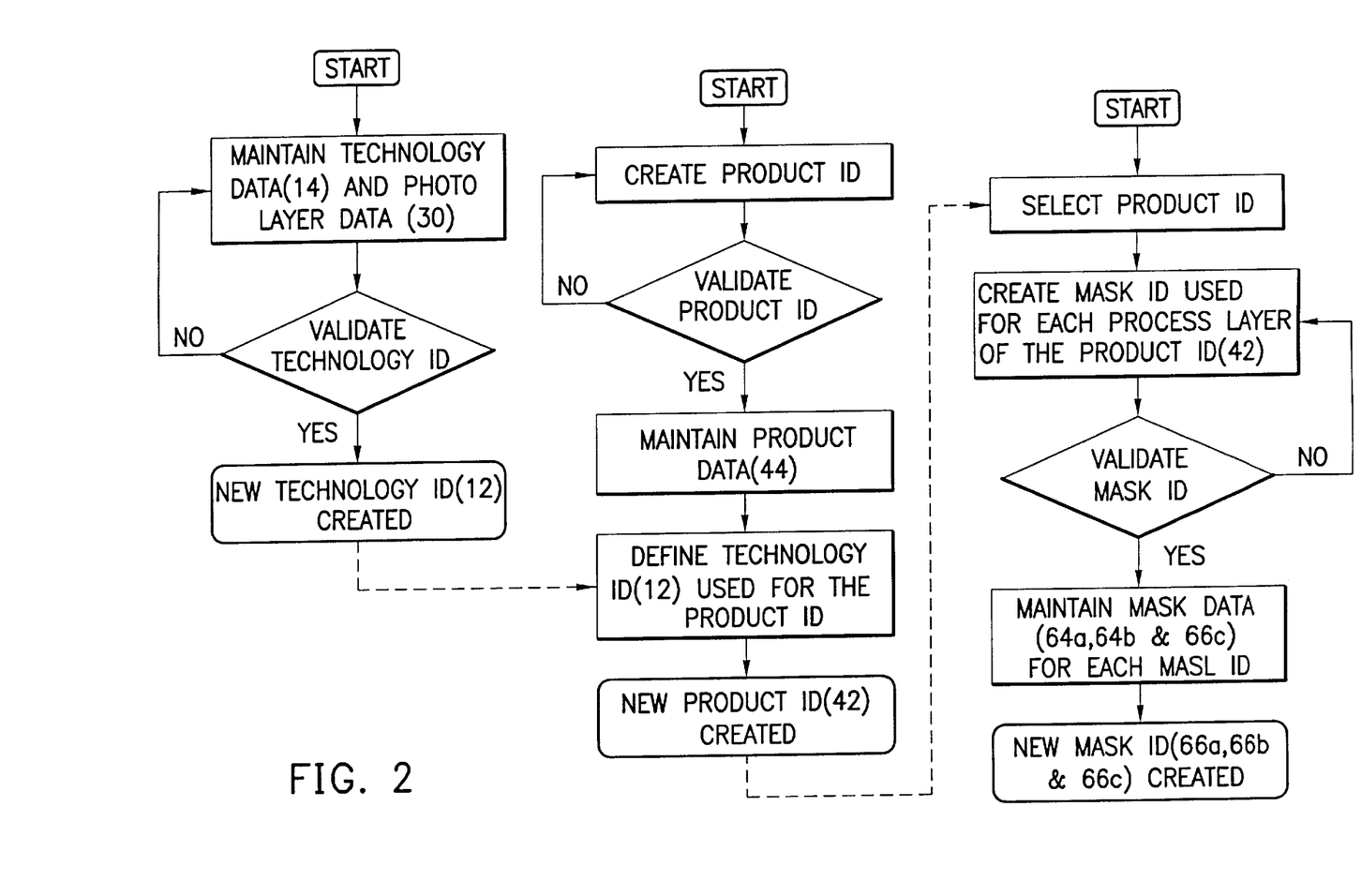
FIG. 2 shows the flowchart of a method for preparing the data of a product to set up a data structure according to the present invention.

Before a new product, such as a wafer, is released to a FAB to be fabricated, a data structure of the new product is prepared and set up first according to the method of the present invention. FIG. 2 shows a flowchart to schematically describe the algorithm involved in preparing the process data of a product in order to set up a data structure according to the present invention, wherein said algorithm is executed by a computer having a memory.

Referring to both FIG. 1 and FIG. 2 at the same time, a technology data 14 and a photo layer data 30 are maintained accordingly, then the validation of a technology ID is checked. If the technology ID is successfully validated, then a new technology ID 12 is created; otherwise the validation step is ended and looped back to the beginning step in which the technology data 14 and the photo layer data 30 are maintained. Thereby, a technology table 10 is established and stored in the memory of the computer.

After establishing the technology table 10, a product ID is created. The validation of the product ID is then checked such that if the product ID cannot be successfully validated, the validation step ends and loops back to the beginning step in which another product ID can be created. If the product ID can be successfully validated, then the product data 44 are maintained. In addition, a technology ID 14 that corresponds to the product ID is defined, and then a new product ID 42 is created. Thereby, a product table 40 is established and stored in the memory of the computer. In particular, the technology table 10 and the product table 40 are linked via the technology ID 12 and a product link table 46.

Select the newly created product ID 42 after establishing the product table 40. Create a plurality of mask IDs for each corresponding process layer of the new product ID 42. The validation of each of the mask IDs is then checked such that if the mask IDs cannot be successfully validated, the validation step ends and loops back to the beginning step in which another mask IDs can be created. On the other hand, if the mask IDs can be successfully validated, then the next step is to maintain the mask data 64a, 64b, and 64c for each mask ID. Thereby, a mask table 60 is established and stored in the memory of the computer. As shown in FIG. 1, the product table 40 and the mask table 60 are linked via the new product ID 42 and a mask link table 62.

Hence, according to the data structure of the present invention, the technology table 10 and the product table 40 are linked via the new technology ID 12 and the product link table 46; the product table 40 and the mask table 60 are linked via the new product ID 42 and the mask link table 62.

THE EMBODIMENT

FIG. 3 through FIG. 7 are detailed descriptions of the user interface displayed by the monitor of a computer to further illustrate the data structure of a product technology according to the present invention.

Figure 3:
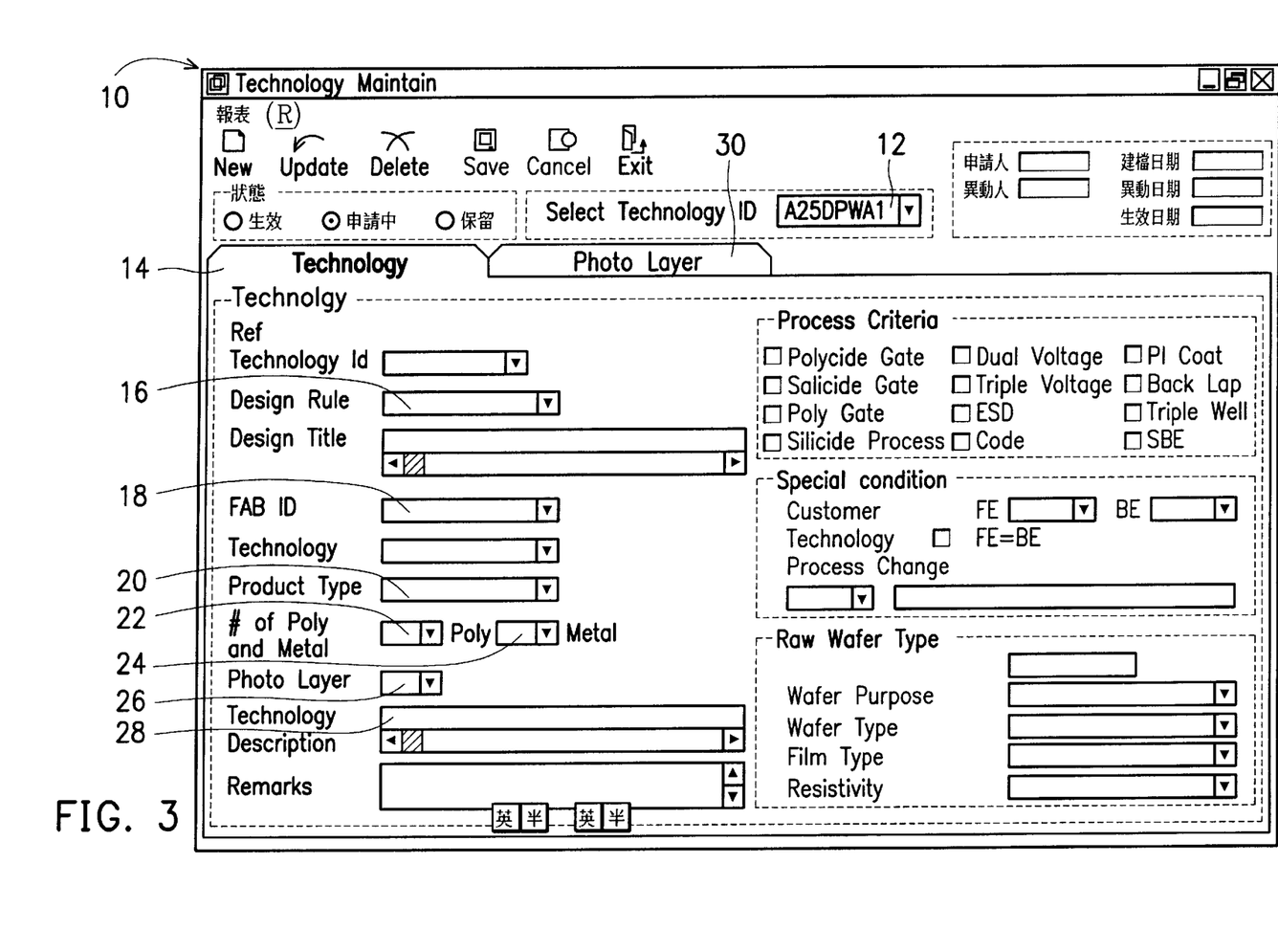
FIG. 3 shows a screen display illustrating a user interface to which various criteria and conditions etc. are inputted to create the technology data of the technology table according to an embodiment of the present invention.

Referring to FIG. 3, a technology table 10 is shown for inputting a product technology used by a product, which is then stored in the memory of a computer. Accordingly, the technology table 10 comprises a technology ID 12, a technology data 14, and a photo layer data 30. FIG. 3 shows a screen displayed by the monitor of a computer illustrating a selection menu of various criteria and conditions etc. included in the technology data 14 of the technology table 10 according to the present invention, wherein the technology ID 12 shown in FIG. 3 is defined to be A25DPWA1 as an example. The technology data 14 in the technology table 10 further comprises several items with blank spaces for typing in critical information relevant to a specific product technology. According to an embodiment of the present invention, the items are arranged to include such information as design rule 16, FAB ID 18, product type 20, number of poly layer 22, number of metal layer 24, number of photo layer 26, technology description 28, and so on. Wherein, the design rule 16 records a feature dimension of the product technology; the FAB ID 18 records which FAB is used for the product technology; the product type 20 records which type of product pertains to the technology, which can include, for example, a memory chip or a logic chip; the number of photo layer 26 records how many photolithography processes the product technology uses.

Figure 4:
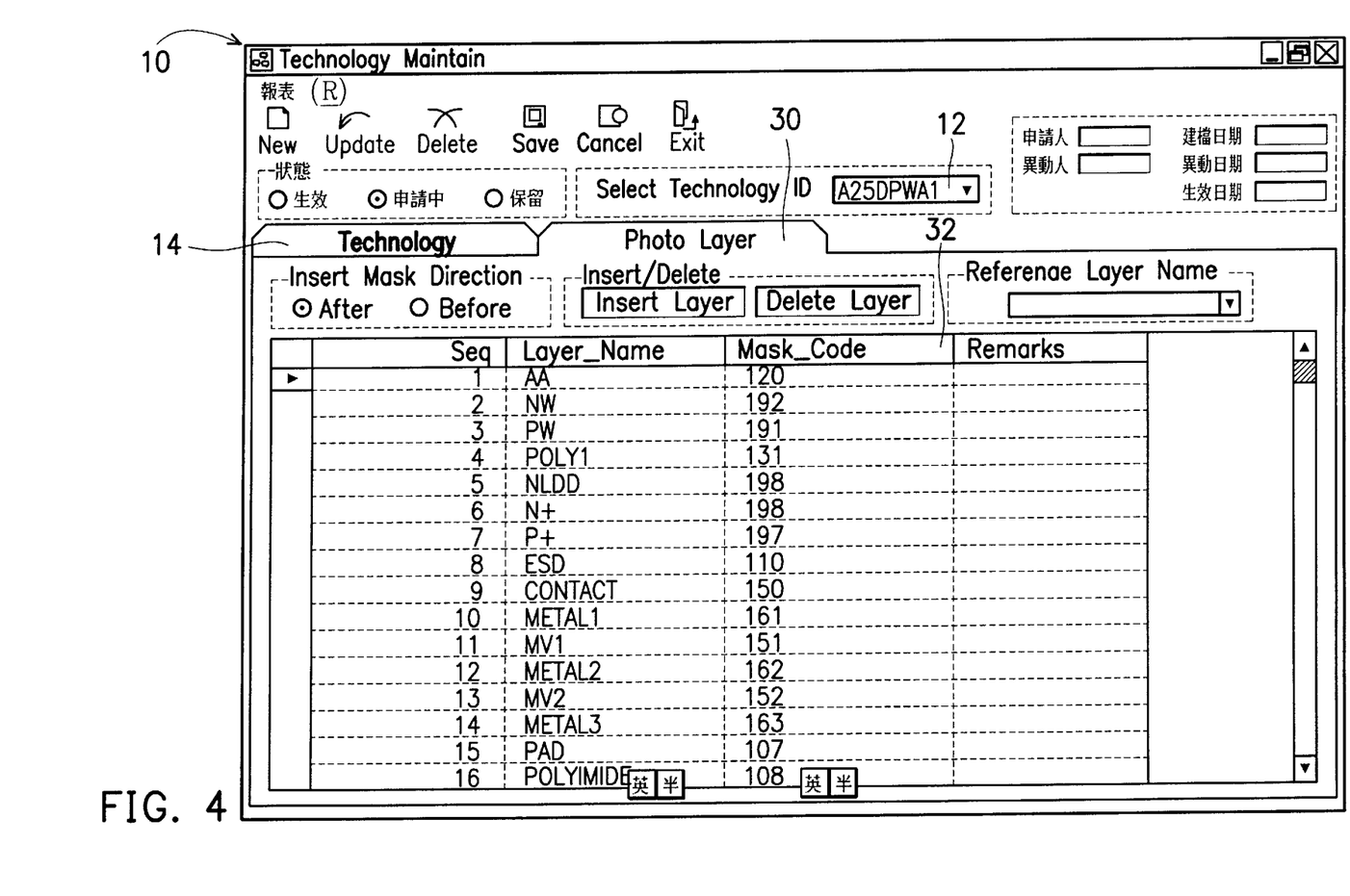
FIG. 4 is a screen display illustrating the photo layer data of the technology table according to the data structure of the present invention.

FIG. 4 shows a screen displayed by the monitor of a computer illustrating the photo layer data 30 of the technology table 10 according to the present invention, wherein the technology ID 12 is defined to be A25DPWA1 as an example. A table as show in FIG. 4 constitutes the photo layer data 30. The photo layer data 30 comprises at least one layer code 32 having a layer_name and a mask_code used to record the respective layer and mask information of each process. For example, the layer_name AA and mask_code 120 shown in FIG. 4 indicate that the mask is used to proceed an active region process, whereas the layer_name NW and mask_code 192 indicate that the mask is used to proceed an N type well formation process.

Figure 5:
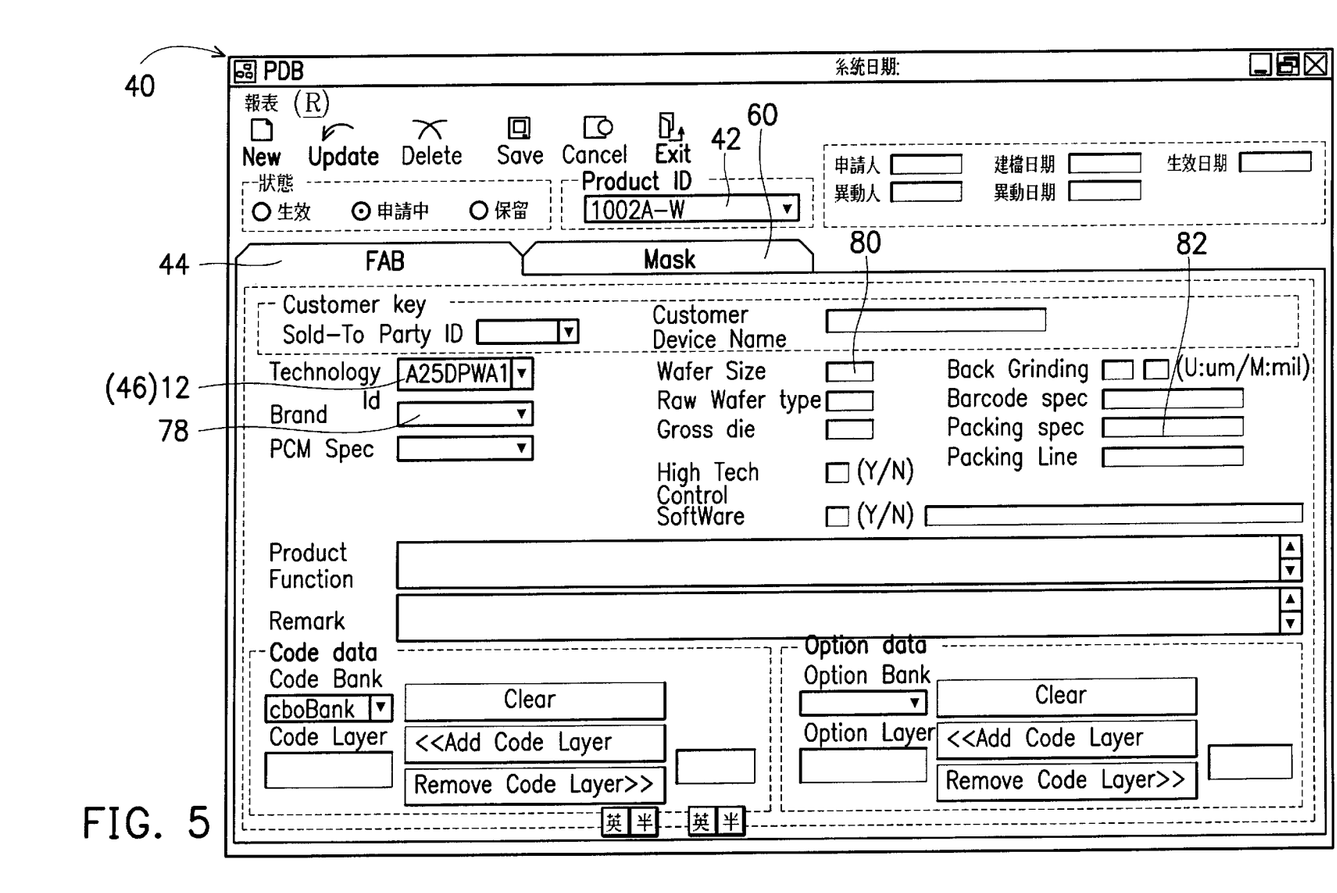
FIG. 5 is a screen display illustrating a product table according to the data structure of the present invention.

Referring to FIG. 5, a product table 40 used for recording the specification of a product in the memory of a computer is shown. FIG. 5 shows a screen displayed by the monitor of a computer illustrating the product table 40 according to an embodiment of the present invention, wherein the technology ID 12 is defined to be A25DPWA1 and the product ID 42 to be 1002A-W, for example. Furthermore, the product table 40 at least comprises a product ID 42 for identifying the product and a product data 44 for making a description of the product's features. The product data 44 comprises a product link table 46 for providing a link to the technology table 10, wafer size 48, packing specification 50, brand information 52, and so on, as shown in FIG. 1. According to this embodiment of the present invention, the product link table 46 is interfaced through a selection of the technology ID 12, wherein the product table 40 is linked with the technology table 10 via the product link table 46.

Figure 6:
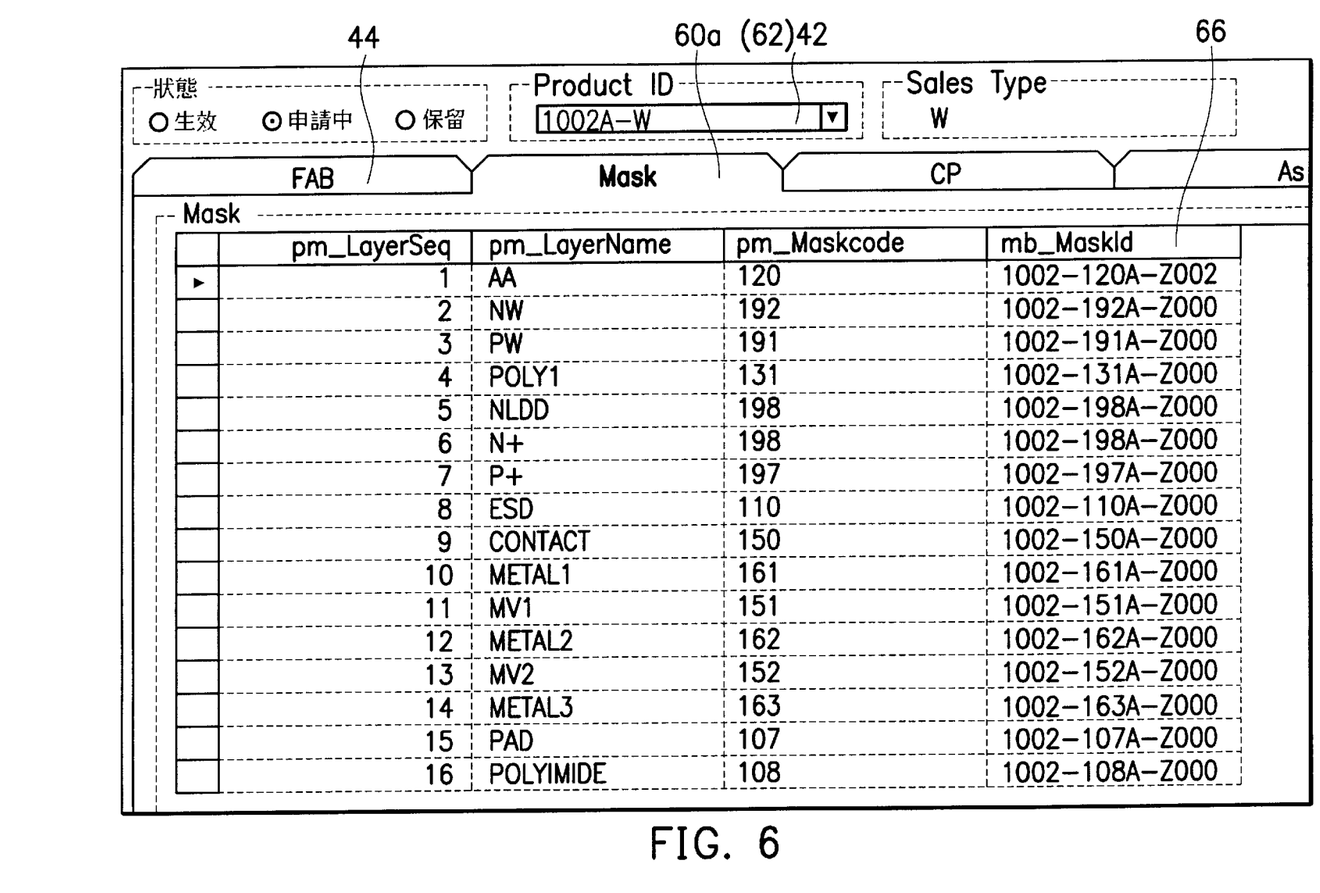
FIG. 6 is a screen display illustrating a mask table according to the data structure of the present invention.

Referring to FIG. 6, a mask table 60 for recording the masks used by the product in the memory of a computer is shown. FIG. 6 shows a screen displayed by the monitor of a computer illustrating the mask table 60 according to the present invention. The mask table 60 comprises a table that lists all of the masks used by a specific product, and the technology ID 12 is defined to be A25DPWA1 and the product ID 42 to be 1002A-W, for example. Furthermore, the mask table 60 comprises a mask link table 62 for providing a link to the product table 40. According to this embodiment of the present invention, the mask link table 62 is interfaced through a selection of the product ID 42, wherein the mask table 60 is linked with the product table 40 via the mask link table 62. Referring to FIG. 1, the mask table 60 comprises a plurality of mask IDs 66a, 66b, and 66c in order to distinguish and name each mask of the process layer. For example, the mask ID 1002-120A-Z002 shown in the table of FIG. 6 may represent an active region process while the mask ID 1002-192A-Z000 represents an N type well formation process for the fabrication of a semiconductor product.

Figure 7:
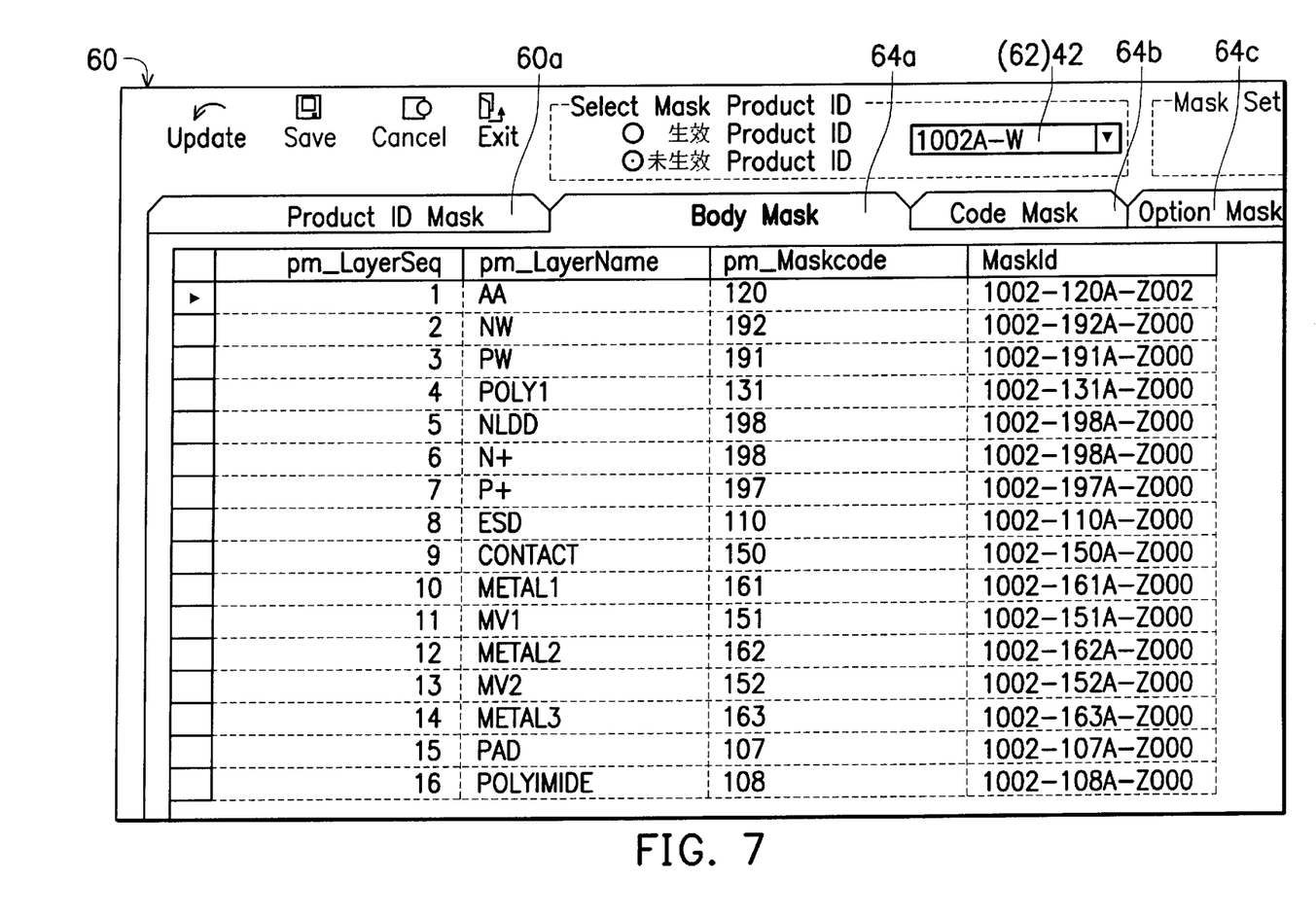
FIG. 7 is a screen display illustrating a more detailed description of a mask table which is divided into body mask data, code mask data, and option mask data according to the data structure of the present invention.

Furthermore, the mask table 60 can be divided into three different types by function: body mask data 64a, code mask data 64b, and option mask data 64c, as shown in FIG. 7, which is a screen displayed by the monitor of a computer illustrating the mask table 60 according to the present invention.

According to the aforementioned method of preparing data of a product to set up the data structure, the links among the technology table 10, the product table 40, and the mask table 60 ensure that relevant process data of a product technology and the products themselves are consistent at all times. Therefore, relevant information contained in the product table 40, the mask table 60, and the technology table 10 can be easily accessed from the data structure by first inputting the product ID 42 and technology ID 12 through a user interface.

Therefore, the technology table 10, the product table 40, and the tool table 60 are established with links among each other. At the same time, the data structure according to the present invention is set up by strictly following the procedures of a flowchart as shown in FIG. 2, which is executable by a computer to prevent possible errors in signing off approval forms to be passed around among different departments within an organization from occurring. Thus, as shown in FIG. 1, the efficiency in manufacturing a product is enhanced according to the present invention such that the data among the technology table 10, the product table 40, and the tool table 60 can be updated consistently, globally, and automatically due to the inter-linked characteristic of said tables.

While the invention has been described with reference to various illustrative embodiments, the description is not intended to be construed in a limiting sense. Various modifications of the illustrative embodiments, as well as other embodiments of the invention, will be apparent to those skilled in the art upon reference to this description. It is therefore contemplated that the appended claims will cover any such modifications or embodiments as may fall within the scope of the invention defined by the following claims and their equivalents.

What is claimed is:

1. A data structure for preparing and maintaining data relating to a product to be stored in a memory of a computer, comprising:

a technology table for recording a product technology used by the product, wherein said technology table at least comprises a technology ID for identifying the product technology used by the product and a process layer data for recording the information of each process layer, and wherein the process layer data comprises at least a layer code that corresponds to a process layer;

a product table for recording a specification of the product, wherein said product table at least comprises a product ID for identifying the product and a product data for making a description of the product, and wherein the product data comprises a product link table for providing a link to said technology table; and a tool table comprising at least one tool ID for identifying the tools used by each of the process layers and a tool link table for providing a link to said product table, wherein the tool ID is linked with a corresponding layer code of said technology table.

2. The data structure as claimed in claim 1, wherein the product is a semiconductor chip such that the product technology used by the product comprises a photolithography process, and wherein the tools are masks used during the photolithography process.

3. The data structure as claimed in claim 2, wherein said technology table further comprises a technology data having at least a FAB ID, a plurality of photo layer, a plurality of metal layer, and a design rule.

4. The data structure as claimed in claim 2, wherein the product data further comprises such information as wafer size, packing specification, and brand information.

5. A method of preparing a data structure of a product to be executed by a computer having a memory, comprising:

storing a technology table in the memory of a computer such that said technology table includes a product technology applicable to a product, wherein said technology table at least comprises a technology ID for identifying the product technology used by the product and a process layer data for recording the information of each process layer, and wherein the process layer data comprises at least a layer code that corresponds to a process layer;

storing a product table in the memory of a computer such that said product table includes a specification of the product, wherein said product table at least comprises a product ID for identifying the product and a product data for making a description of the product, and wherein the product data comprises a product link table for providing a link to said technology table; and creating at least one tool ID for each process layer to establish a tool table and then store said tool table in the memory of a computer, wherein said tool table comprises a tool link table for providing a link to said product table.

6. The method as claimed in claim 5, wherein the product is a semiconductor chip such that the product technology used by the product comprises a photolithography process.

7. The method as claimed in claim 6, wherein said technology table further comprises a technology data having at least a FAB ID, a plurality of photo layer, a plurality of metal layer, and a design rule.

8. The method as claimed in claim 6, wherein the product data further comprises such information as wafer size, packing specification, and brand information.

9. The method as claimed in claim 5, wherein the tool ID is used to name and distinguish the tools used by each process layer.

* * * * *